United States Patent
Vu

(10) Patent No.: US 7,078,900 B2
(45) Date of Patent: Jul. 18, 2006

(54) METHOD AND SYSTEM OF DETERMINING PARAMETERS FOR MR DATA ACQUISITION WITH REAL-TIME $B_1$ OPTIMIZATION

(75) Inventor: Anthony T. Vu, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/897,477

(22) Filed: Jul. 23, 2004

(65) Prior Publication Data

US 2006/0017437 A1    Jan. 26, 2006

(51) Int. Cl.
    *G01V 3/00* (2006.01)
(52) U.S. Cl. ..................................... 324/314
(58) Field of Classification Search ............... 324/314, 324/307, 309
    See application file for complete search history.

(56) References Cited

U.S. PATENT DOCUMENTS

| | | | |
|---|---|---|---|
| 6,426,623 B1 * | 7/2002 | Bernstein | 324/314 |
| 6,759,847 B1 * | 7/2004 | Brinker et al. | 324/309 |
| 6,836,114 B1 * | 12/2004 | Reddy et al. | 324/307 |
| 2003/0080738 A1 * | 5/2003 | Brinker et al. | 324/309 |
| 2003/0098600 A1 * | 5/2003 | Brinker et al. | 324/309 |
| 2003/0098687 A1 * | 5/2003 | Ameth et al. | 324/309 |
| 2004/0263166 A1 * | 12/2004 | Kluge | 324/309 |

* cited by examiner

*Primary Examiner*—Diego Gutierrez
*Assistant Examiner*—Jeremiah Shipman
(74) *Attorney, Agent, or Firm*—Ziolkowski Patent Solutions Group, SC; Michael A. Della Penna; Carl B. Horton

(57) ABSTRACT

The present invention provides a system and method of MR scan prescription to achieve in a fast, simple, and effective manner the optimal peak excitation field strength for a given pulse shape and flip angle such that the minimum TR for the MR scan can be optimized and based on SAR constraints. The present invention provides a technique to obtain optimal $B_1$ parameters for an arbitrary shape and flip angle of an excitation pulse in real-time while satisfying SAR and/or RF hardware limits to determine the minimum achievable repetition time for a pulse sequence. The present invention is particularly applicable with breath-hold and cardiac imaging techniques that are carried out at relatively high field strengths.

29 Claims, 2 Drawing Sheets

METHOD AND SYSTEM OF DETERMINING PARAMETERS FOR MR DATA ACQUISITION WITH REAL-TIME $B_1$ OPTIMIZATION

BACKGROUND OF THE INVENTION

The present invention relates generally to MR imaging and, more particularly, to a method and system of determining and setting excitation pulse parameters for MR data acquisition to minimize repetition time for a given pulse sequence without exceeding prescribed electromagnetic energy exposure levels and RF heating limits.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well-known reconstruction techniques.

In prescribing an MR scan, a number of parameters must be determined to effectively acquire MR data such that a diagnostically valuable MR image can be reconstructed. These parameters include the type of imaging protocol to be used, spin echo or gradient echo, flip angles, single slice or multi-slice acquisition, and k-space filling scheme. Another parameter that also must be considered is the repetition time (TR) of the pulse sequence that will be applied for MR data acquisition. The TR of an MR scan defines how frequently a pulse sequence will be applied to image a particular region-of-interest (ROI).

Generally, it is desirable to conduct an MR scan with the shortest possible TR so as to expedite the MR data acquisition process. In this regard, acquiring MR data expeditiously reduces the likelihood of subject discomfort in the MR scanner, which reduces the likelihood of subject-induced motion artifacts, mis-registration of MR data, and subject fatigue during breath-hold applications, as well as increases patient throughput. Accordingly, the conventional approach for optimizing short TR pulse sequences is to use the maximum available excitation field strength to achieve the shortest RF duration for a given pulse shape and flip angle. The maximum available excitation field strength is typically a function of the RF coil and amplifier systems of the MR scanner. As such, a pulse sequence having a given pulse shape and flip angle will not be repeated at a repetition time shorter than that supported by the MR scanner hardware.

Additionally, it has been shown that for high-field applications, relying upon the maximum available excitation field strength for pulse sequences requiring short TR and large flip angles is less than optimal. This is a result of the minimum TR being constrained by specific absorption rate (SAR) limitations. As such, for high-field pulse sequences having short TR and large flip angles such as FIESTA and ce-MRA (SPGR), the minimum achievable repetition time ($TR_{min}$) is predominantly limited by SAR constraints resulting in a repetition time longer in duration than the minimum repetition time supported by the MR scanner or desired for the given pulse sequence.

The SAR of an MR scan quantifies the amount of electromagnetic energy to which a subject is exposed during the MR scan. SAR can be generally defined as a function of flip angle of a given pulse sequence which depends on the excitation field strength and the duration of the prescribed excitation pulse as set forth in the following expression:

$$SAR \approx W \approx \omega B_1^2 \tau = \gamma B_0^2 \Theta^2 \tau / (\eta \gamma \tau)^2 = B_0^2 \Theta^2 / \eta^2 \tau,$$

where W=energy deposit per pulse, $\Theta$=flip angle, $B_0$=the static field strength, $B_1$=RF magnetic field strength, $\tau$=RF pulse duration, $\eta$=waveform factor, $\gamma$=gyro-magnetic ratio.

From the above expression, it is clear that the amount of RF energy deposited during an MR scan increases by a factor of two in proportion to the excitation field strength. For instance, the SAR for an MR scan conducted at 3 T is four times the SAR of an MR scan conducted at 1.5 T. As such, pulse sequences requiring large flip angles and short TRs, while possible at 1.5 T, may be unachievable at higher magnetic field strengths, such as 3 T, because the desired TR at the high field is not feasible. That is, the minimum TR required for the high-field pulse sequence may require an excitation field strength that results in RF exposure and/or RF heating that exceeds a maximum industry-permitted SAR for the given MR scan. One skilled in the art will appreciate that the maximum SAR levels are generally set by government regulatory agencies such as the Food and Drug Administration in the United States.

One approach to reduce the minimum achievable repetition time for a given pulse sequence is to reduce the flip angle of the excitation RF pulse so as to reduce the SAR level for that pulse sequence. However, simply reducing the flip angle of the RF pulse might not be desirable given that alteration in signal-to-noise and/or contrast-to-noise might result in less than optimal image quality. Additionally, simply lowering the maximum available $B_1$ strength or magnitude of the RF pulse can degrade pulse sequence performance and, hence, negatively affect image quality severely if not performed appropriately.

It would therefore be desirable to design a method and system of judiciously and automatically setting the maximum available excitation field strength for MR data acquisition to minimize TR for the pulse sequence without exceeding prescribed SAR and RF heating limits.

BRIEF DESCRIPTION OF THE INVENTION

The present invention provides a system and method of MR scan prescription to achieve, in a fast, simple, and effective manner, the optimal peak excitation field strength for a given pulse shape and flip angle such that the minimum TR for the MR scan will not be arbitrarily limited by SAR constraints so as to overcome the aforementioned drawbacks. In this regard, the present invention provides a method to obtain optimal $B_1$ parameters in real-time for an arbitrary shape and flip angle of the excitation RF pulse of a pulse sequence such that SAR and/or RF hardware limits will not be the quintessential limiting factor in determining the minimum achievable repetition time for the pulse sequence. As such, the present invention provides an effective and straightforward technique to achieve the shortest possible TR for a pulse sequence having a large flip angle while maintaining SAR at or below prescribed levels. The present invention is applicable with a number of imaging techniques to provide high resolution MR images from MR data acquired in relatively short repetition times. The present invention is particularly applicable with breath-hold and cardiac imaging techniques that are carried out at relatively high field strengths.

Therefore, in accordance with one aspect of the present invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to model a SAR constrained minimum TR for a given pulse sequence and adjust strength of an excitation pulse of a pulse sequence based on the model. The computer is further programmed to determine if the strength of the excitation pulse is inside a range of acceptable excitation field strength values and if so, commence imaging, and if not, repeat the modeling, adjusting, and determining acts until strength of the excitation pulse is adjusted to a value minimally inside the range of acceptable $B_1$ excitation field strength values.

In accordance with another aspect of the invention, a method of SAR management for MR data acquisition includes the step of determining a SAR constrained minimum TR for a given pulse sequence. The method further includes the step of determining a non-SAR constrained minimum TR for a given pulse sequence and the step of comparing the SAR constrained minimum TR and a non-SAR constrained minimum TR. The method further includes the step of setting one of an excitation field strength and an excitation pulse duration of the pulse sequence based on the comparison.

In accordance with another aspect of the invention, the invention is embodied in a computer program stored on a computer readable storage medium and having instructions which, when executed by a computer, cause the computer to determine one of excitation pulse magnitude and excitation pulse duration of MR pulse sequence and determine a first minimum TR for the MR pulse sequence based on at least one of the excitation pulse magnitude and excitation pulse duration such that SAR during the first known TR does not exceed a given prescribed SAR level. The set of instructions further causes the computer to determine a second minimum TR for the MR pulse sequence based on other parameters of the MR pulse sequence, wherein the second minimum TR is independent of SAR constraints. The computer is then caused to determine a minimum TR target range from the second minimum TR and compare the first minimum TR to the minimum TR target range. Based on this comparison, the set of instructions causes the computer to adjust one of excitation pulse magnitude and/or excitation pulse duration of an excitation pulse of the MR pulse sequence.

Various other features, objects, and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
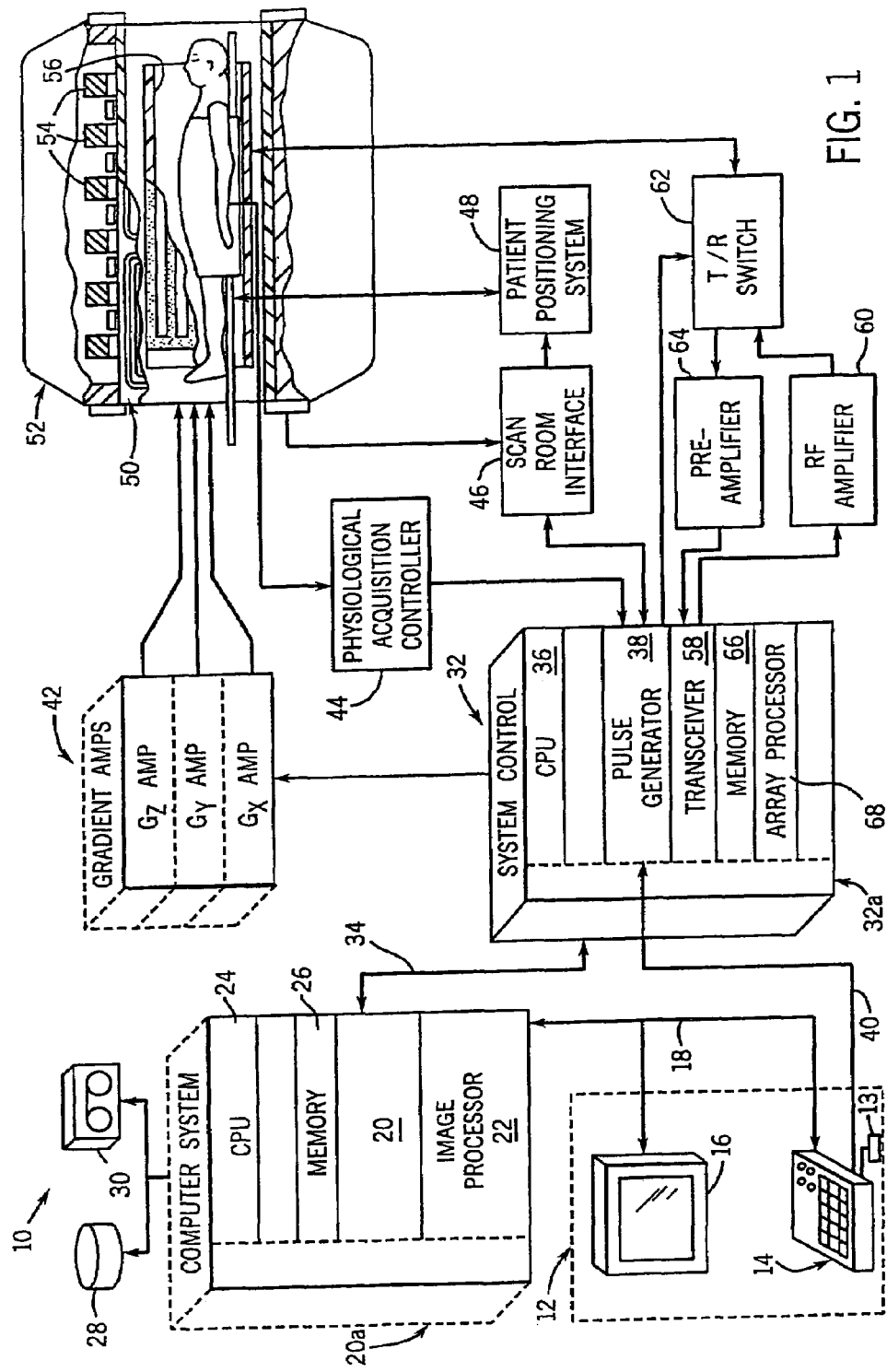
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24, and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. The set includes a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength, and shape of the RF pulses produced, and the timing and length of the data acquisition window. The pulse generator module 38 connects to a set of gradient amplifiers 42 to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a method and system of SAR management applicable with the MR scanner described with respect to FIG. 1. The present invention is particularly directed to a technique of providing fast, simple, yet effective approach to determine an optimized peak magnitude for an excitation pulse at a given pulse shape and a flip angle so as to minimize the repetition time for the pulse sequence in a manner not solely limited by SAR constraints. The present invention is particularly applicable to high field pulse sequence applications having large flip angles and relatively short repetition times. Examples of such pulse sequences include FIESTA imaging pulse sequences, ce-MRA imaging pulse sequences, and the like. However, one skilled in the art will appreciate that the present invention is applicable with a multitude of other pulse sequences. Additionally, the present invention is believed to be particularly applicable for neuro/body/cardiovascular imaging.

Figure 2:
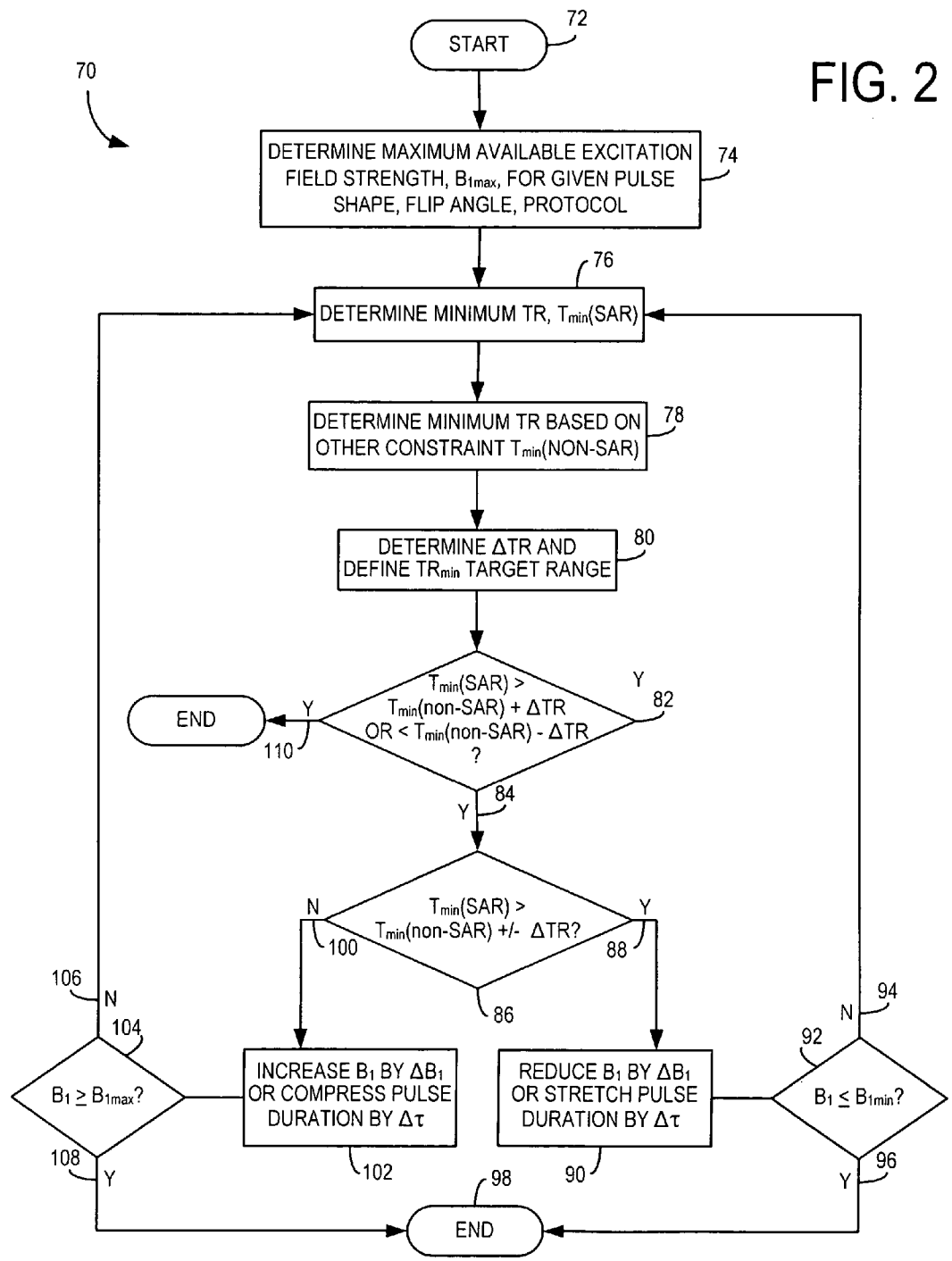
FIG. 2 is a flow chart setting forth the step of a real-time $B_1$ optimization technique to minimize TR for a given pulse sequence and MR scanner in accordance with the present invention.

Referring now to FIG. 2, a flow chart setting forth the steps of a real-time $B_1$ optimization technique to minimize TR for a given pulse sequence and MR scanner in accordance with the present invention is shown. The $B_1$ optimization technique 70 begins at 72 with the prescription of an MR scan defined by a pulse sequence having an RF excitation pulse with a given pulse shaping, flip angle, and protocol. For the prescribed MR scan, technique 70 determines a maximum available excitation field strength, $B_{1\ max}$ at 74. The maximum available excitation field strength determined is based on hardware limitations of the MR scanner and, more particularly, on constraints of the RF coil and amplifier assemblies of the MR scanner. In addition to the maximum available excitation field strength, technique 70 determines an SAR constrained minimum TR, $TR_{min}$ (SAR) at 76. In this regard, optimization technique 70 determines the minimum allowable repetition time of the prescribed pulse sequence permitted without the SAR level during the scan exceeding a prescribed level. It is contemplated that the SAR constrained minimum TR may be determined based on an empirical SAR prediction model or likewise determined mathematically from a theoretical mean.

As referenced above, the present invention contemplates a real-time $B_1$ optimization scheme whereby the minimum TR for a given MR scan will not solely be limited by SAR constraints. As such, $B_1$ optimization technique 70 continues at 78 with a determination of a minimum repetition time, $TR_{min}$(non-SAR) based on other, non-SAR constraints for the prescribed pulse sequence. These non-SAR constraints include but are not limited to waveform time, gradient coil limitations, as well as amplifier constraints. From the determined non-SAR constrained minimum repetition time 78, technique 70 continues with determination of a repetition time variance or deviation, $\Delta TR$, that is used to define a minimum repetition time target range, $TR_{min\_range}$ ($TR_{min}$(non-SAR)+/−$\Delta TR$) 80. As will be described, a relationship between the SAR constrained minimum TR and the $TR_{min\text{-}range}$ may be exploited to determine what adjustments, if any, should be made to the $B_1$ strength of the excitation pulse of the prescribed pulse sequence.

After the minimal repetition time range has been defined 80, optimization technique 70 then compares the SAR constrained minimum TR with the $TR_{min\text{-}range}$ to determine if the SAR constrained minimum TR is outside the acceptable $TR_{min}$ range 82. If yes 84, a comparison is then made at 86 to determine if the SAR constrained minimum repetition time exceeds the minimum non-SAR constrained TR plus the acceptable TR deviation, $\Delta TR$. If yes 88, the magnitude of the excitation pulse of the prescribed pulse sequence at 90 is reduced by an incremental amount, $\Delta B_1$. Alternatively, the pulse duration of the prescribed $B_1$ pulse may be increased by $\Delta \tau$. In this regard, a change in the excitation pulse of the prescribed pulse sequence will not be effectuated unless the modeled or theoretically derived SAR constrained minimum repetition time exceeds the repetition time target range. Accordingly, a change to the excitation pulse of the prescribed pulse sequence will not be made unless the SAR constrained minimum TR determined at 76 is outside an acceptable range relative to the non-SAR constrained TR determined at 78.

Following reduction in the magnitude of the RF pulse of the prescribed pulse sequence by adjustment $\Delta B_1$, or the increase in the RF pulse duration $\Delta \tau$ 90, a comparison is then made to determine whether the reduced magnitude of the excitation pulse is below a minimum value required for effective data acquisition at 92. If not 92, 94, optimization technique 70 returns to step 76 to redetermine the SAR constrained minimum TR based on the adjusted excitation field magnitude. Thereafter, the comparison steps heretofore described are repeated. On the other hand, if the reduced magnitude of the excitation pulse is less than or equal to the given $B_1$ magnitude minimum 92, 96, the optimization process is complete at 98 with prescription of the pulse sequence with the magnitude of the excitation pulse being at or minimally below the predetermined $B_1$ magnitude minimum.

If, however, optimization technique 70 determines that the SAR constrained minimum TR falls within the target range $TR_{min}$(non-SAR)+/−$\Delta TR$ 110, the optimization process is complete at 98. In this case, the SAR constrained minimum TR and the non-SAR constrained TR are deemed to have converged to be within acceptable limits and the pulse sequence is defined as having available excitation field strength unchanged from its previous value and the TR for the MR scan is set to the larger of the two TR i.e. $TR_{min}$ (non-SAR) and $TR_{min}$(SAR).

However, if the SAR constrained minimum TR is neither more nor within the $TR_{min}$ target range, 100, then the available magnitude of the excitation pulse of the pulse sequence is increased by the adjustment amount, $\Delta B_1$ at 102. Alternatively, the duration of the RF excitation pulse may be reduced by $\Delta \tau$. In this regard, allowing an increase in SAR may be achieved by either increasing the available magnitude of the excitation pulse or decreasing pulse duration of the excitation pulse by $\Delta \tau$. Following an increase in the available field strength of the RF pulse by $\Delta B_1$ or compression of the RF pulse duration by $\Delta \tau$, it is determined if the increase in the available $B_1$ field strength is greater than or equal to the maximum available excitation field strength 104. If not 104, 106, then the optimization technique returns to step 76 with redetermination of the SAR constrained minimum repetition time for the given pulse sequence with an excitation pulse having a magnitude increased by $\Delta B_1$ at 102. In this regard, optimization technique redetermines and compares the SAR constrained minimum TR with the non-SAR constrained minimum TR until a magnitude of the RF excitation pulse of the pulse sequence is set to a level that results in an SAR constrained minimum TR within a target TR minimum range. As such, if the SAR constrained minimum TR is less than the minimum TR desired for the pulse sequence, the present invention allows for judicious and incremental increase in the magnitude of the excitation pulse or, equivalently, shortening of the excitation pulse. As such, the strength or magnitude of the excitation pulse is optimized for the given pulse sequence.

Referring again to FIG. 2, if the increase in the available magnitude of the excitation pulse, $B_1$, is increased to a level that is equal to or in excess of the maximum available excitation field strength 104, 108, the optimization technique concludes 98 with the MR scan being conducted with a TR defined by the larger of the two TR, i.e. the minimum TR required for the given pulse sequence, while playing out the excitation pulse at the maximum available field strength. That is, if the SAR constrained minimum TR is shorter than the minimum TR required for the pulse sequence, then the pulse sequence will be played out in such a manner that the strength or magnitude of the excitation pulse will be equal to the maximum available strength supported by the MR scanner for the given pulse shape, flip angle, and imaging protocol.

In another embodiment, optimization technique 70 may also take into consideration RF amplifier heating constraints on minimum TR calculations. That is, the SAR constrained minimum TR may be modified so as to take into account the effects of RF amplifier heating constraints to yield an SAR and RF amplifier minimum TR, $TR_{min}$(SAR, RF amplifier). In this regard, in determining what adjustments, if any, should be made to the available magnitude of the excitation pulse or its duration, not only will SAR limitations be taken into account, but so will RF amplifier heating limitations.

The present technique is effective and straightforward in its application in achieving the shortest possible TR for large flip angle protocols while maintaining SAR at or below prescribed levels. The invention is particularly applicable for large flip angle/short TR imaging protocols such as FIESTA or ce-MRA whereby the present invention, with reduced TRs, achieves high SNR/CNR without degrading image quality at high fields. The aforedescribed optimization technique may be applied to a number of pulse sequences including those directed to neuro, body, or cardiovascular applications. The present invention has also been shown to provide high resolution breath-hold imaging at high fields.

Referring now to Tables 1–4 set forth below, a comparison between conventional TR minimization techniques and that realized with the present invention are set forth. For example, in Table 1, the present invention provides approximately a full percent reduction in minimum TR for imaging various sized subjects with a 2D FIESTA protocol with 192×192 imaging matrix, a field-of-view (FOV) of 35 cm, a slice thickness of 5 mm, receiver bandwidth of +/−125 kHz, and a flip angle of 45 degrees. As shown, the present invention realized an optimal TR for the aforementioned pulse sequence of 3.2 ms for each subject weight of 300, 200, and 160 pounds. Moreover, for the 300 pound subject, the present invention realizes a 37.25 percent reduction in minimum TR, for the 200 pound subject, a 41.82 percent reduction in TR, and for the 160 pound subject, a 46.67 percent reduction in minimum TR.

TABLE 1

| Weight(lbs) | $TR_{product}$(ms) | $TR_{opt}$(ms) | % reduction |
|---|---|---|---|
| 300 | 5.10 | 3.2 | 37.25 |
| 200 | 5.50 | 3.2 | 41.82 |
| 160 | 6.00 | 3.2 | 46.67 |

Referring now to Table 2, data was acquired using a 3D FIESTA scan with an FOV of 18/35 cm, 2 mm slice thickness with 32 slices of acquisition, 320phase and frequency encoding steps, a received bandwidth with +/−83 kHz, and a flip angle of 70 degrees. For this exemplary scan, the present invention realizes a 31.25 percent reduction in minimum TR for a 300 pound subject and a 31.65 percent reduction in minimum TR for a 250 pound subject.

TABLE 2

| Weight(lbs) | $TR_{product}$(ms) | $TR_{opt}$(ms) | % reduction |
|---|---|---|---|
| 300 | 8.00 | 5.5 | 31.25 |
| 250 | 7.90 | 5.4 | 31.65 |

The data set forth in Table 3 illustrates that for a 3D FIESTA with 224×160 k-space matrix, FOV of 30 cm, a 12-slice acquisition with each slice being 2.6 mm thick, a receiver bandwidth of +/−125 kHz, and a flip angle of 60 degrees, more than a 70 percent reduction in minimum TR was realized for a 90 pound subject. An approximate 34 percent reduction in minimum TR was realized for a 300 pound subject and an approximate 70 percent reduction in minimum TR was realized for a 45 pound subject.

TABLE 3

| Weight(lbs) | $TR_{product}$(ms) | $TR_{opt}$(ms) | % reduction |
|---|---|---|---|
| 300 | 5.30 | 3.5 | 33.96 |
| 90 | 12.10 | 3.5 | 71.07 |
| 45 | 11.60 | 3.6 | 68.97 |

As set forth in Table 4, the present invention also realizes significant reduction in minimum TR for a CE-MR angiographic scan with a 256×160 k-space matrix, an FOV of 36 cm, a 32-slice acquisition with each slice being 3 mm thick, a receiver bandwidth of +/−62.5 kHz, and flip angle of 45 degrees. Specifically, for a 300 pound scan subject, the present invention realizes a 28.79 percent reduction in minimum TR. The optimization technique described herein also determined a minimum TR of 4.7 ms versus the 6.60 ms determined using conventional TR minimization techniques.

TABLE 4

| Weight(lbs) | $TR_{product}$(ms) | $TR_{opt}$(ms) | % reduction |
|---|---|---|---|
| 300 | 6.60 | 4.7 | 28.79 |
| 90 | 9.80 | 4.6 | 53.06 |
| 45 | 12.86 | 4.5 | 65.01 |

The present invention provides a relatively straightforward technique to achieve minimum TR for a given pulse sequence with optimization of the excitation field to be within SAR and/or RF hardware constraints. Moreover, the present invention achieves $B_1$ optimization without lowering or otherwise adjusting the flip angle of the prescribed pulse sequence.

Therefore, a method of SAR management for MR data acquisition includes the step of determining a SAR constrained minimum TR for a given pulse sequence. The method further includes the step of determining a non-SAR constrained minimum TR for a given pulse sequence and the step of comparing the SAR constrained minimum TR and a non-SAR constrained minimum TR. The method further includes the step of setting one of an excitation field strength and an excitation pulse duration of the pulse sequence based on the comparison.

An MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to model an SAR constrained minimum TR for a given pulse sequence and adjust strength of a $B_1$ pulse of a pulse sequence from the model. The computer is further programmed to determine if the strength of the $B_1$ pulse is outside a range of acceptable $B_1$ field strength values and if so, commence imaging, and if not, repeat the modeling, adjusting, and determining acts until strength of $B_1$ pulse is adjusted to a value minimally outside the range of acceptable $B_1$ field strength values.

The invention may also be embodied in a computer program stored on a computer readable storage medium and having instructions which, when executed by a computer, cause the computer to determine one of excitation pulse magnitude and excitation pulse duration of MR pulse sequence and determine a first known TR for the MR pulse sequence based on at least one of the excitation pulse magnitude and excitation pulse duration such that SAR during the first known TR does not exceed a given prescribed SAR level. The set of instructions further causes the computer to determine a second minimum TR for the MR pulse sequence based on other parameters of the MR pulse sequence wherein the second minimum TR is independent of SAR constraints. The computer is then caused to determine a minimum TR target range from the second minimum TR and compare the first minimum TR to the minimum TR target range. Based on this comparison, the set of instructions causes the computer to adjust one of excitation pulse magnitude and excitation pulse duration of a excitation pulse of the MR pulse sequence.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
 a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
 a computer programmed to:
 (A) model a SAR constrained minimum TR for a given pulse sequence;
 (B) adjust strength of a $B_1$ pulse of the pulse sequence based on the model;
 (C) determine if the strength of the $B_1$ pulse is inside a range of acceptable $B_1$ field strength values; and if so, commence imaging, and if not,
 (D) repeat (A)–(C) until strength of the $B_1$ pulse is adjusted to a value minimally inside the range of acceptable $B_1$ field strength values;
 wherein the computer is further programmed to decrement the strength of the $B_1$ pulse if the SAR constrained minimum TR exceeds a non-SAR constrained minimum TR and increment the strength of the $B_1$ pulse if the SAR constrained minimum TR is less than the non-SAR constrained minimum TR.

2. The MR system of claim 1 wherein the computer is further programmed to adjust the strength of the $B_1$ pulse by a predetermined value, $\Delta B_1$.

3. An MRI apparatus comprising:
 a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
 a computer programmed to:
 (A) model a SAR constrained minimum TR for a given pulse sequence;
 (B) adjust strength of a $B_1$ pulse of the pulse sequence based on the model;
 (C) determine if the strength of the $B_1$ pulse is inside a range of acceptable $B_1$ field strength values; and if so, commence imaging, and if not,
 (D) repeat (A)–(C) until strength of the $B_1$ pulse is adjusted to a value minimally inside the range of acceptable $B_1$ field strength values;
 wherein the computer is further programmed to determine a maximum available and a minimum available $B_1$ field strength for the given pulse sequence based on constraints of at least the RF coil assembly.

4. The MR system of claim 3 wherein the computer is further programmed to limit adjustment of the strength of the $B_1$ pulse to the maximum available $B_1$ field strength or the minimum available $B_1$ field strength.

5. An MRI apparatus comprising:
 a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
 a computer programmed to:
 (A) model a SAR constrained minimum TR for a given pulse sequence;

(B) adjust strength of a $B_1$ pulse of the pulse sequence based on the model;

(C) determine if the strength of the $B_1$ pulse is inside a range of acceptable $B_1$ field strength values; and if so, commence imaging, and if not, (D) repeat (A)–(C) until strength of the $B_1$ pulse is adjusted to a value minimally inside the range of acceptable $B_1$ field strength values;

wherein the computer is further programmed to determine a non-SAR constrained minimum TR, and repeatedly adjust the strength of the $B_1$ pulse and remodel the SAR constrained minimum TR until the non-SAR constrained minimum TR and the SAR constrained minimum TR converge to be within a predetermined convergence range.

6. The MR system of claim 5 wherein the computer is further programmed to adjust duration of the $B_1$ pulse in lieu of an adjustment to the strength of the $B_1$ pulse.

7. A method of SAR management for MR data acquisition, the method comprising the steps of:

determining a SAR constrained minimum TR for a given pulse sequence;

determining a non-SAR constrained minimum TR for the given pulse sequence;

comparing the SAR constrained minimum TR and the non-SAR constrained minimum TR; and setting one of an excitation field strength level and an excitation pulse duration of the pulse sequence based on the comparison.

8. The method of claim 7 wherein the step of setting includes adjusting one of an initial excitation field strength level and an initial excitation pulse duration such that a difference between the SAR constrained minimum TR and the non-SAR constrained minimum TR is reduced.

9. The method of claim 8 further comprising the step of reducing the initial excitation field strength level or increasing the initial excitation pulse duration if the SAR constrained minimum TR is more than the non-SAR constrained minimum TR.

10. The method of claim 9 further comprising the step of determining if the reduced excitation field strength level is less than a minimum excitation field strength level and, if not, redetermining an SAR constrained minimum TR.

11. The method of claim 10 further comprising the step of reiteratively reducing the reduced excitation field strength level and redetermining the SAR constrained minimum TR until the SAR constrained minimum TR is less than the non-SAR constrained minimum TR.

12. The method of claim 8 further comprising the step of increasing one of the initial excitation field strength level or decreasing the initial excitation pulse duration if the SAR constrained minimum TR is less than the non-SAR constrained minimum TR.

13. The method of claim 12 further comprising the step of determining if the increased excitation field strength level is more than a maximum available excitation field strength level and, if not, redetermining an SAR constrained minimum TR.

14. The method of claim 13 further comprising the step of reiteratively increasing the excitation field strength level and redetermining the SAR constrained minimum TR until the SAR constrained minimum TR is less than the non-SAR constrained minimum TR.

15. The method of claim 7 wherein the step of comparing includes comparing the SAR constrained minimum TR to the non-SAR constrained minimum TR +/−a TR deviation.

16. The method of claim 7 further comprising the step of determining a maximum available excitation field strength level for a given MR scanner and parameters of the pulse sequence.

17. The method of claim 16 wherein the parameters include pulse shape, flip angle, and imaging protocol.

18. The method of claim 7 wherein the step of determining an SAR constrained minimum TR includes empirically predicting the SAR constrained minimum TR for a current excitation pulse duration.

19. The method of claim 7 further comprising the step of setting one of excitation field strength level and excitation pulse duration such that SAR during MR data acquisition does not exceed a prescribed level.

20. The method of claim 7 further comprising the step of determining the non-SAR constrained minimum TR based on at least one of waveform time, gradient coil characteristics, and amplifier constraint.

21. A computer readable storage medium having a computer program stored thereon and representing a set of instructions that when executed by a computer causes the computer to:

determine one of excitation pulse magnitude and excitation pulse duration of an MR pulse sequence;

determine a first minimum TR for the MR pulse sequence based on a least one of the excitation pulse magnitude and excitation pulse duration such that SAR during the first minimum TR does not exceed a given prescribed SAR level;

determine a second minimum TR for the MR pulse sequence based on other parameters of the MR pulse sequence, wherein the second minimum TR is independent of SAR constraints;

determine a minimum TR target range from the second minimum TR;

compare the first minimum TR to the minimum TR target range; and adjust one of excitation pulse magnitude and excitation pulse duration of an excitation pulse of the MR pulse sequence from the comparison.

22. The computer readable storage medium of claim 21 wherein the set of instructions further causes the computer to adjust the first minimum TR as a function of RF amplifier heating constraint and compare the adjusted first minimum TR to the minimum TR target range.

23. The computer readable storage medium of claim 21 wherein the set of instructions further causes the computer to adjust excitation pulse magnitude by a predetermined magnitude adjustment interval or adjust excitation pulse duration by a predetermined pulse width adjustment interval from the comparison.

24. The computer readable storage medium of claim 23 wherein the set of instructions further causes the computer to adjust excitation pulse magnitude from the comparison, and compare an increased excitation pulse magnitude to a maximum available excitation pulse magnitude and if the increased excitation pulse magnitude exceeds the maximum available excitation pulse magnitude, then set the excitation pulse magnitude to the maximum available excitation pulse magnitude.

25. The computer readable storage medium of claim 24 wherein the set of instructions further causes the computer to determine the maximum available excitation pulse magnitude for a given pulse shape and flip angle of the MR pulse sequence from constraints of an RF coil assembly of an MR scanner.

26. The computer readable storage medium of claim 23 wherein the set of instructions further causes the computer to adjust excitation pulse magnitude from the comparison, and compare a reduced excitation pulse magnitude to a minimum acceptable excitation pulse magnitude and if the reduced excitation pulse magnitude is less than the minimum acceptable excitation pulse magnitude, then set the excitation pulse magnitude to the minimum acceptable excitation pulse magnitude.

27. The computer readable storage medium of claim 21 wherein the set of instructions further causes the computer to increase excitation pulse magnitude or reduce excitation pulse duration if the first minimum TR is less than the minimum TR target range and reduce excitation pulse magnitude or increase excitation pulse duration if the first minimum TR is more than the minimum TR target range.

28. The computer readable storage medium of claim 21 wherein the set of instructions further causes the computer to determine the first minimum TR from an empirical SAR predictive model.

29. The computer readable storage medium of claim 21 wherein the MR pulse sequence is configured for breath-hold MR data acquisition.

* * * * *

UNITED STATES PATENT AND TRADEMARK OFFICE
CERTIFICATE OF CORRECTION

PATENT NO. : 7,078,900 B2
APPLICATION NO. : 10/897477
DATED : July 18, 2006
INVENTOR(S) : Vu It is certified that error appears in the above-identified patent and that said Letters Patent is hereby corrected as shown below:

On the cover page,

[*] Notice: Subject to any disclaimer, the term of this patent is extended or adjusted under 35 USC 154(b) by 0 days Delete the phrase "by 0 days" and insert -- by 61 days --

Signed and Sealed this

Eighteenth Day of November, 2008

JON W. DUDAS
*Director of the United States Patent and Trademark Office*